(12) United States Patent
Chen et al.

(10) Patent No.: US 9,595,506 B2
(45) Date of Patent: *Mar. 14, 2017

(54) PACKAGES WITH THERMAL MANAGEMENT FEATURES FOR REDUCED THERMAL CROSSTALK AND METHODS OF FORMING SAME

(71) Applicant: Taiwan Semiconductor Manufacturing Company, Ltd., Hsin-Chu (TW)

(72) Inventors: Kim Hong Chen, Fremont, CA (US); Wensen Hung, Zhubei (TW); Szu-Po Huang, Taichung (TW); Shin-Puu Jeng, Po-Shan Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/997,826

(22) Filed: Jan. 18, 2016

(65) Prior Publication Data

US 2016/0133602 A1 May 12, 2016

Related U.S. Application Data

(63) Continuation of application No. 14/103,523, filed on Dec. 11, 2013, now Pat. No. 9,269,694.

(51) Int. Cl.
| | | |
|---|---|---|
| *H01L 23/34* | (2006.01) | |
| *H01L 25/065* | (2006.01) | |
| *H01L 23/367* | (2006.01) | |
| *H01L 25/00* | (2006.01) | |
| *H01L 23/373* | (2006.01) | |
| *H01L 23/42* | (2006.01) | |
| *H01L 23/498* | (2006.01) | |

(Continued)

(52) U.S. Cl.
CPC ...... *H01L 25/0655* (2013.01); *H01L 23/3128* (2013.01); *H01L 23/367* (2013.01); *H01L 23/3675* (2013.01); *H01L 23/3737* (2013.01); *H01L 23/42* (2013.01); *H01L 23/49827* (2013.01); *H01L 25/50* (2013.01); *H01L 2023/4056* (2013.01); *H01L 2023/4062* (2013.01); *H01L 2023/4068* (2013.01); *H01L 2224/16145* (2013.01); *H01L 2224/16225* (2013.01); *H01L 2924/0002* (2013.01); *H01L 2924/15311* (2013.01)

(58) Field of Classification Search
CPC .................................... H01L 23/49827
USPC .................. 257/712–715; 438/107, 122
See application file for complete search history.

(56) References Cited

U.S. PATENT DOCUMENTS 9,269,694 B2 * 2/2016 Chen ............... H01L 23/49827
2005/0068739 A1 3/2005 Arvelo et al.

(Continued)

*Primary Examiner* — Dung Le
(74) *Attorney, Agent, or Firm* — Slater Matsil, LLP

(57) ABSTRACT

An embodiment package includes a first die stack on a surface of a package component, a second die stack on the surface of the package component, and a contour lid over the first die stack and second die stack. The contour lid includes a first thermal conductive portion over the first die stack, a second thermal conductive portion over the second die stack, and a thermal barrier portion between the first thermal conductive portion and the second thermal conductive portion. The thermal barrier portion includes a low thermal conductivity material.

20 Claims, 14 Drawing Sheets

(51) Int. Cl.
*H01L 23/31* (2006.01)
*H01L 23/40* (2006.01)

(56) References Cited

U.S. PATENT DOCUMENTS

| | | |
|---|---|---|
| 2006/0290011 A1 | 12/2006 | Cobbley et al. |
| 2012/0182694 A1 | 7/2012 | Lin et al. |
| 2013/0105964 A1 | 5/2013 | Seki |
| 2014/0197541 A1 | 7/2014 | Stephens et al. |
| 2014/0252645 A1 | 9/2014 | Kim et al. |
| 2015/0001701 A1 | 1/2015 | Li et al. |

\* cited by examiner

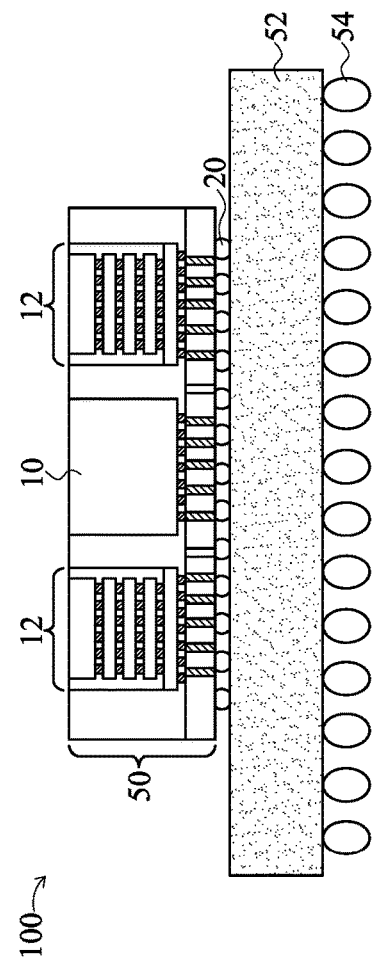
Fig. 1B
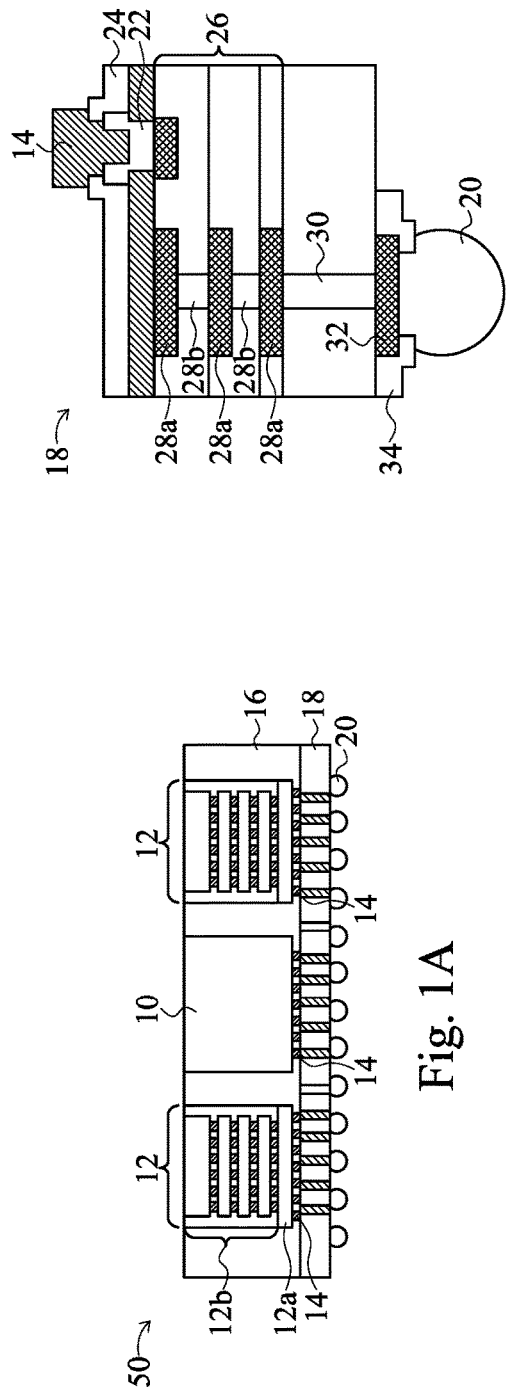
Fig. 1A
Fig. 1C

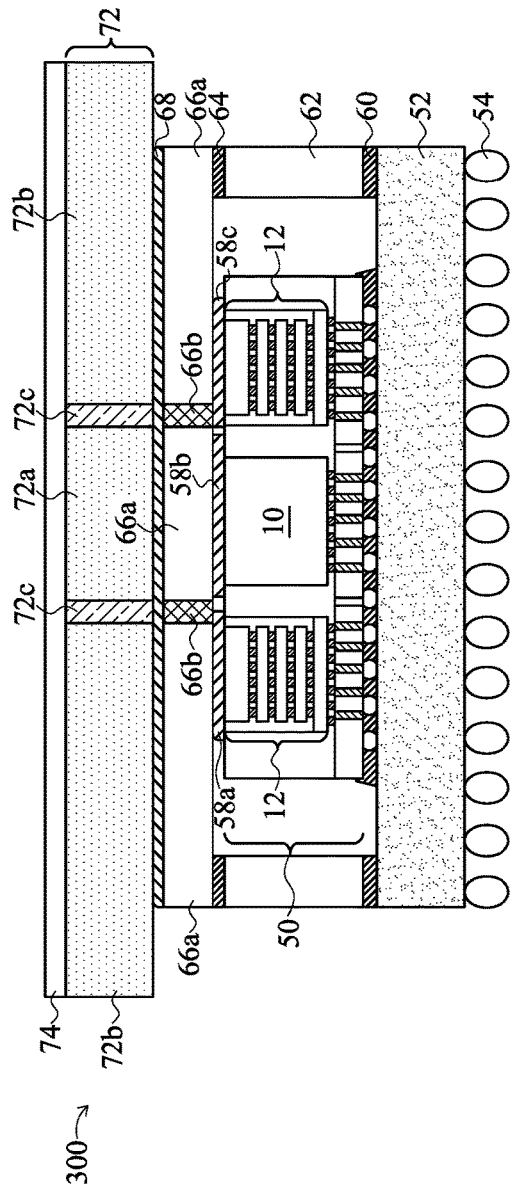
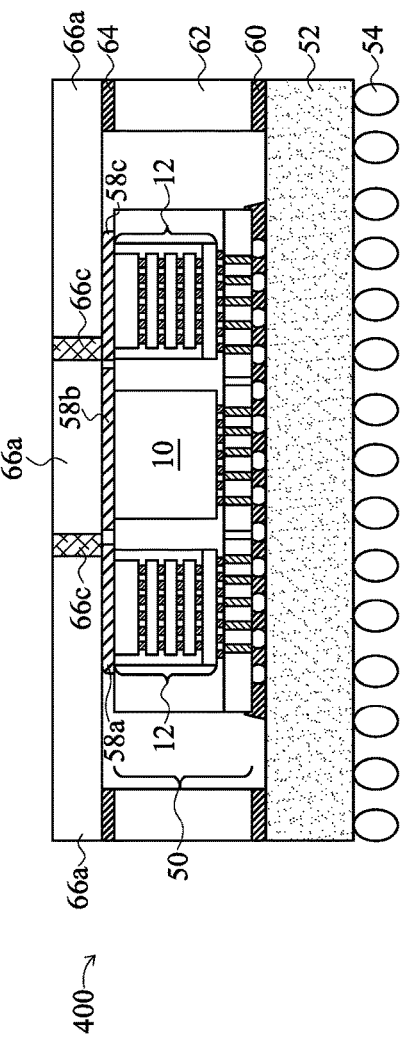
Fig. 3
Fig. 4A

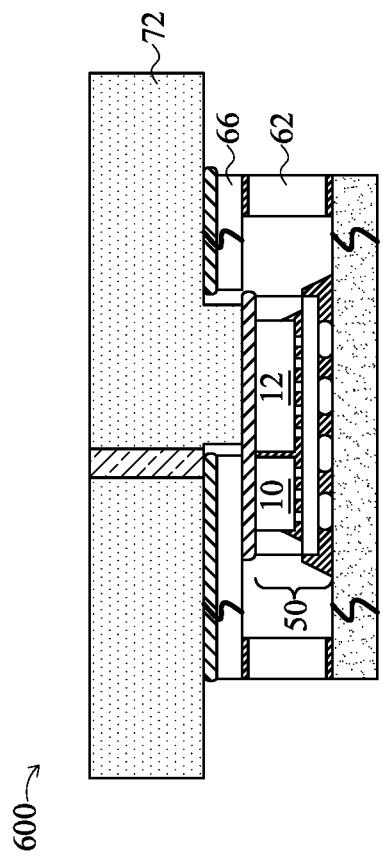
Fig. 6A
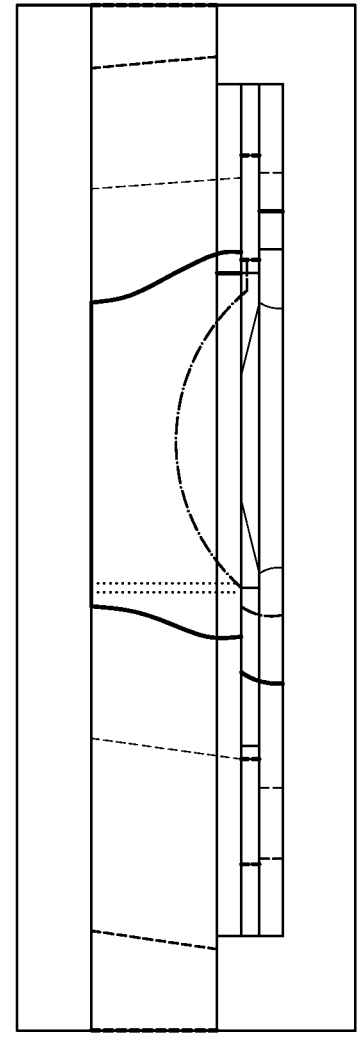
Fig. 6B
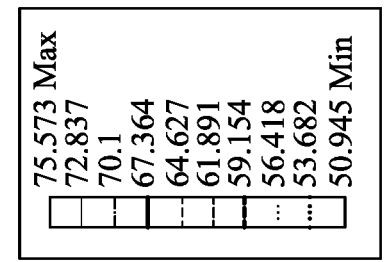

PACKAGES WITH THERMAL MANAGEMENT FEATURES FOR REDUCED THERMAL CROSSTALK AND METHODS OF FORMING SAME

This application is a continuation of application Ser. No. 14/103,523, filed on Dec. 11, 2013, entitled "Packages with Thermal Management Features for Reduced Thermal Crosstalk and Methods of Forming Same," now U.S. Pat. No. 9,269,694, which applications are hereby incorporated herein by reference.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Heat dissipation is a challenge in the 3DICs.

A bottleneck may exist in efficiently dissipating the heat generated in the inner dies of the 3DICs. In a typical 3DIC, the heat generated in inner dies may have to be dissipated to outer components before the heat can be conducted to a heat spreader. Between the stacked dies and outer components, however, there exist other materials such as underfill, molding compound, and the like, which are not effective in conducting heat. As a result, the heat may be trapped in an inner region of a bottom stacked die and cause a sharp local temperature peak (sometimes referred to as a hot spot). Furthermore, hot spots due to heat generated by high-power consuming dies may cause thermal crosstalk problems for surrounding dies, negatively affecting the surrounding dies' performance and the reliability of the whole 3DIC package.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A through 1J illustrate cross-sectional views of intermediate stages of manufacturing a 3DIC package in accordance with various embodiments;

FIG. 3 illustrates a cross-sectional view of a 3DIC package in accordance with alternative embodiments;

FIG. 4A through 4G illustrate a cross-sectional and top down views of a 3DIC package in accordance with alternative embodiments;

FIGS. 6A through 6C illustrate a cross-sectional view, simulated contour plot, and simulated temperature plot of a 3DIC package and operational temperatures of the 3DIC package in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Packages having thermal management features for reduced thermal crosstalk and methods of forming same are provided in accordance with various exemplary embodiments. The intermediate stages of forming the packages are illustrated. The variations of the embodiments are discussed. Throughout the various views and illustrative embodiments, like reference numbers are used to designate like elements.

Embodiments will be described with respect to a specific context, namely chip-on-wafer-on-substrate (CoWoS) package. Other embodiments may also be applied, however, to other packages, including other three dimensional integrated circuits (3DIC) packages.

Figure 1D:
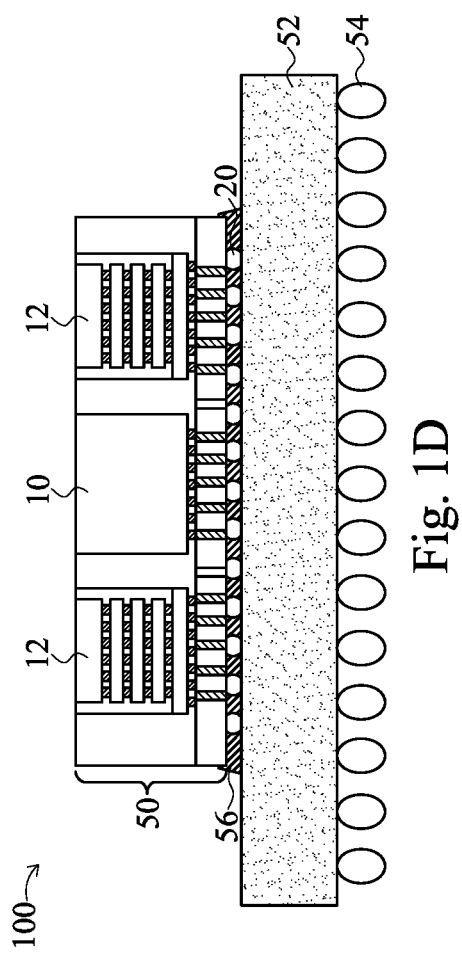

FIGS. 1A through 1H illustrate cross-sectional views of intermediate stages of manufacturing a 3DIC package, such as a chip-on-wafer-on-substrate (CoWoS) package 100 in accordance with various embodiments. FIG. 1A illustrates a cross-sectional view of a chip-on-wafer (CoW) package 50. CoW package 50 includes a high-power consuming die or die stack 10 disposed between two low-power consuming die stacks 12 (sometimes referred to as chips 10 and 12). Die stack 10 is high-power consuming die and may consume a relatively high amount of power, and hence generate a relatively large amount of heat, compared to low-power consuming die stacks 12. For example, high-power consuming die stack 10 may consume between about 50 W and about 100 W of power whereas low-power consuming die stacks 12 may consume between about 5 W and about 10 W of power.

In some embodiments, die stack 10 may be a single system on chip (SoC) die, multiple SoC stacked dies, or the like. For example, FIG. 1I illustrates a cross-sectional view of a CoWoS package 100 where die stack 10 includes multiple stacked dies (e.g., SoC dies) in accordance with various embodiments. In some embodiments, die stacks 12 may be HBM (high bandwidth memory) and/or HMC (high memory cube) modules, which may include memory dies 12b bonded to a logic die 12a. In alternative embodiments, die stacks 10 and 12 may be other chips having other functions. As illustrated by FIG. 1A, die stacks 10 and 12 may be encased in a molding compound 16. While FIG. 1A illustrates a CoW package 50 having one high-power die stack 10 and two low-power die stacks 12, other embodiments may include any number of high-power die stacks 10 and/or low-power die stacks 12.

Die stacks 10 and 12 are bonded to a top surface of a package component (e.g., interposer 18) through a plurality of connectors 14, which may be microbumps. In alternative embodiments, die stacks 10 and 12 may be bonded to a different package component such as a substrate, a printed circuit board (PCB), or the like. Interposer 18 may be a wafer having interconnect structures for electrically connecting active devices (not shown) in die stacks 10 and 12 to form functional circuits. FIG. 1B illustrates a detailed cross-sectional view of interposer 18 in accordance with various embodiments. A connector 14 of a die stack 10/12 is electrically connected to a contact pad 22 on a top side of interposer 18. A passivation layer 24 may extend over a top surface of interposer 18 and cover edge portions of contact pad 22. Contact pad 22 may be electrically connected to metallization layers 26. Metallization layers 26 may include metal lines 28a and vias 28b formed in a dielectric material (e.g., a low-k dielectric material having a k value lower than about 4.0 or even about 2.8). A through-substrate via (TSV) 30 may electrically connect the metallization layer to a connector 20 on a backside of interposer 18.

In an embodiment, connectors 20 may be controlled collapse chip connection (C4) bumps comprising solder. Connectors 20 may have a larger critical dimension (e.g., pitch) than connectors 14. For example, connectors 20 may have a pitch of about 100 μm while connectors 14 may have a pitch of about 40 μm. Interposer 18 may further have an under-bump metallurgy (UBM) 32 connected to connector 20 and a passivation layer 34 on the backside of interposer 18. Other configurations of interposer 18 may also be used.

Next CoW package 50 is bonded to a substrate 52 using connectors 20. The resulting chip-on-wafer-on-substrate (CoWoS) package 100 is illustrated in FIG. 1C. Substrate 52 may be any suitable package substrate, such as a printed circuit board (PCB), an organic substrate, a ceramic substrate, a motherboard, or the like. Substrate 52 may be used to interconnect CoW package 50 with other packages/devices (see for example packages/devices 11 in FIG. 1J) to form functional circuits. As illustrated by FIG. 1J, these other packages and devices 11 may also be disposed on a surface of substrate 52. Substrate 52 may further include contacts 54 (e.g., ball grid array (BGA) balls) disposed on a surface opposite CoW package 50. Contacts 54 may be used to electrically connect the CoWoS package 100 to a motherboard (not shown) or another device component of an electrical system.

In FIG. 1D, a reflow is performed to reflow and bond connectors 20 to substrate 52. Subsequently, an underfill 56 may be dispensed between CoW package 50 and substrate 52.

Figure 1E:
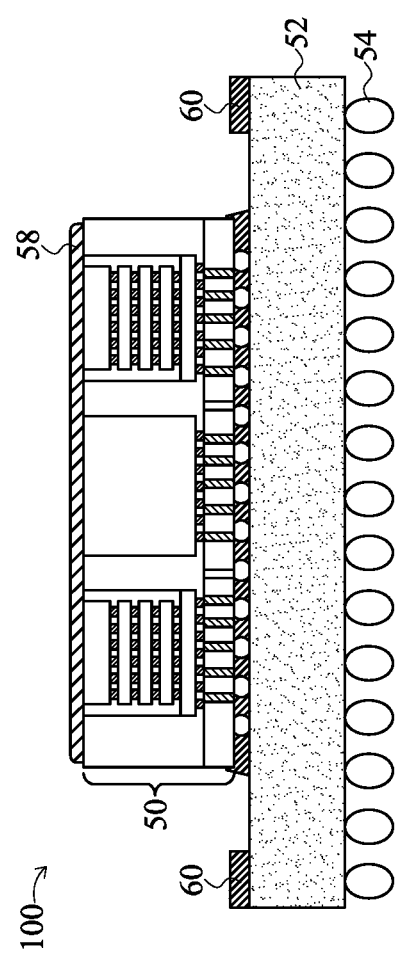

Next, referring to FIG. 1E, a thermal interface material (TIM) 58 is dispensed on CoW package 50. TIM 58 may be a polymer having a good thermal conductivity (Tk), which may be between per meter kelvin (W/m·K) to about 5 W/m·K. In some embodiments, TIM 58 may include a polymer with thermal conductive fillers. The thermal conductive fillers may increase the effective Tk of TIM 58 to be between about 10 W/m·K to about 50 W/m·K or more. Applicable thermal conductive filler materials may include aluminum oxide, boron nitride, aluminum nitride, aluminum, copper, silver, indium, a combination thereof, or the like. In other embodiments, TIM 58 may comprise other materials such as a metallic-based or solder-based material comprising silver, indium paste, or the like. Although TIM 58 is illustrated as a continuous TIM extending over die stack 10 and die stacks 12, in other embodiments, TIM 58 may be physically disconnected. For example, air gaps may be disposed in TIM 58 between adjacent dies (e.g., die stack 10 and/or die stacks 12) to further reduce lateral thermal interaction between die stacks (e.g., as illustrated in FIG. 3).

An adhesive 60 (e.g., an epoxy, silicon resin, or the like) is dispensed over an otherwise unoccupied portion of substrate 52. Adhesive 60 may have a better adhering ability and a lower thermal conductivity than TIM 58. For example, adhesive 60 may have a thermal conductivity lower than about 0.5 W/m·K. Adhesive 60 may be positioned so as to allow a heat dissipating feature (e.g., a contour ring 62, see FIG. 1F) to be attached around CoW package 50. Thus, in some embodiments, adhesive 60 may be disposed around the perimeter of, or even encircle, CoW package 50.

Figure 1F:
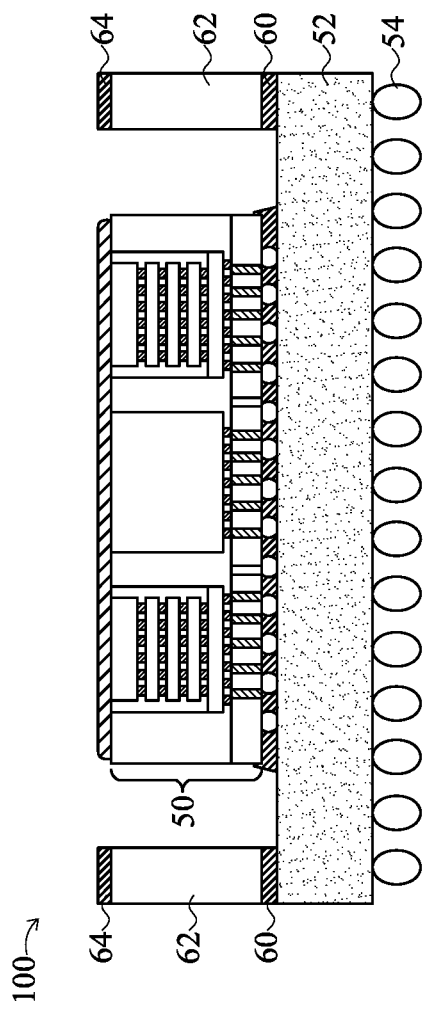

FIG. 1F illustrates a sliced cross-sectional view of CoWoS package 100 after the attachment of a heat dissipating contour ring 62 to substrate 52. In a top-down view of CoWoS package 100 (not shown), contour ring 62 may encircle CoW package 50. A bottom surface of contour ring 62 may be adhered to substrate 52 using adhesive 60. Contour ring 62 may have a high thermal conductivity, for example, between about 200 W/m·K to about 400 W/m·K or more, and may be formed using a metal, a metal alloy, or the like. For example, contour ring 62 may comprise metals and/or metal alloys such as Al, Cu, Ni, Co, combinations thereof, and the like. Contour ring 62 may also be formed of a composite material, for example silicon carbide, aluminum nitride, graphite, and the like. An adhesive 64, which may be substantially similar to adhesive 60, may be dispensed over a top surface of contour ring 62.

Figure 1G:
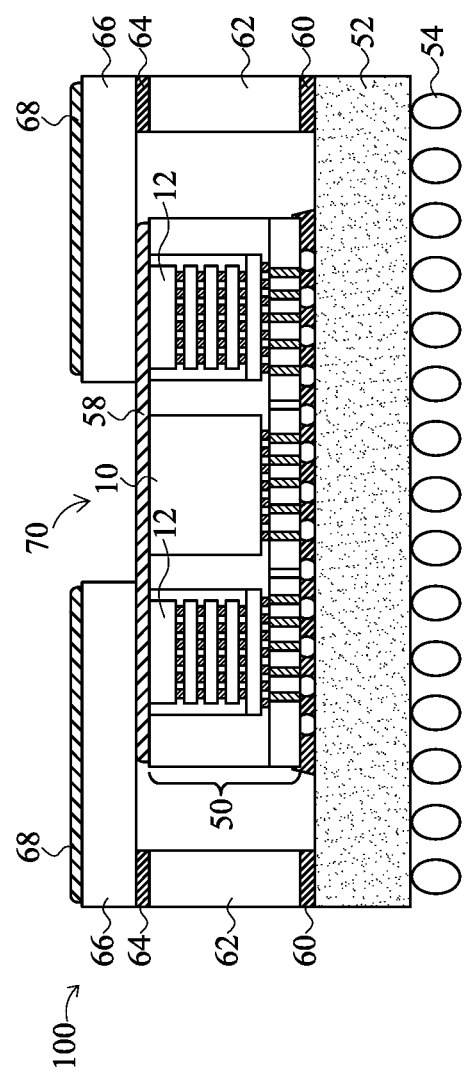

Next, referring to FIG. 1G, a heat dissipating contour lid 66 is mounted over CoW package 50 and contour ring 62. Contour lid 66 may be adhered to contour ring 62 through adhesive 64. Contour lid 66 may be formed of substantially similar materials as contour ring 62, which have a high thermal conductivity, for example, between about 200 W/m·K to about 400 W/m·K or more.

Bottom surfaces of contour lid 66 may be in physical contact with TIM 58. These bottom surfaces in contact with TIM 58 may be aligned with low-power consuming die stacks 10, and heat may be conducted away from low-power consuming die stacks 12 through TIM 58 and contour lid 66. Contour lid 66 may further include an opening 70, which may be aligned with high-power consuming die stack 10. In the embodiment illustrated in FIG. 1G, because the material of lid 66 is excluded from opening 70, heat generated by the high power die stack 10 may not be significantly dissipated and spread through lid 66. As a result, thermal crosstalk between die stacks 10 and 12 may be reduced. The high heat generated in the die stack 10 may be conducted away by a heat spreader 72 (see FIG. 1H) as will be explained in later sections.

TIM 68, which may be substantially similar to TIM 58, may be dispensed over top surfaces of contour lid 66. Generally, the combination of contour ring 62 and contour lid 66 may be referred to as heat dissipation feature 62/66. While FIG. 1G illustrates contour ring 62 and contour lid 66 as separate pieces, in alternative embodiments, contour ring 62 and contour lid 66 may be a single piece heat dissipation feature 62/66 (e.g., see FIG. 5).

Figure 1H:
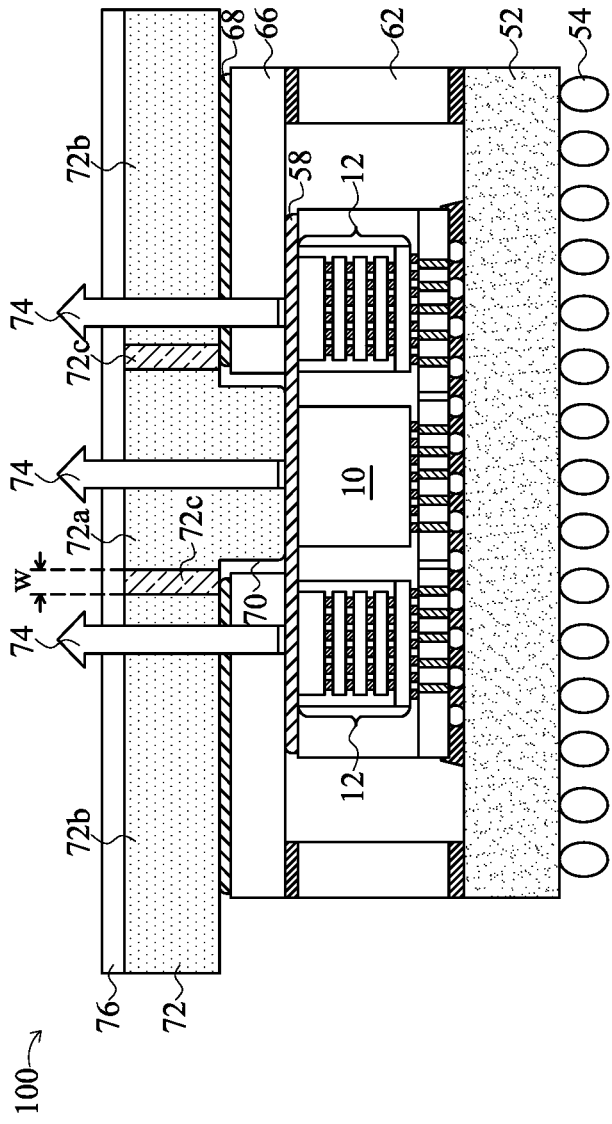
Figure 1I:
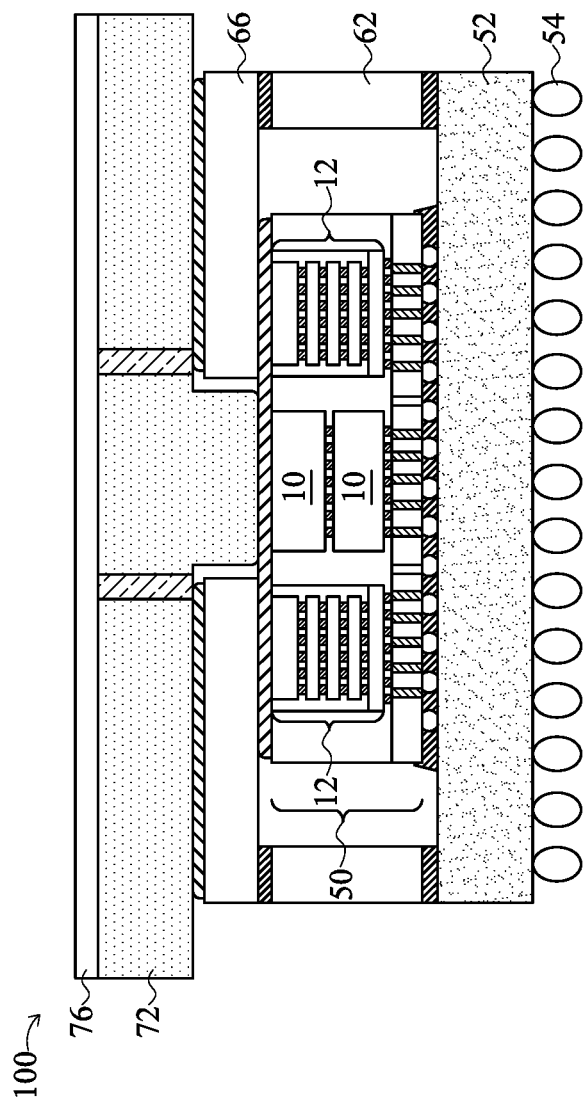
Figure 1J:
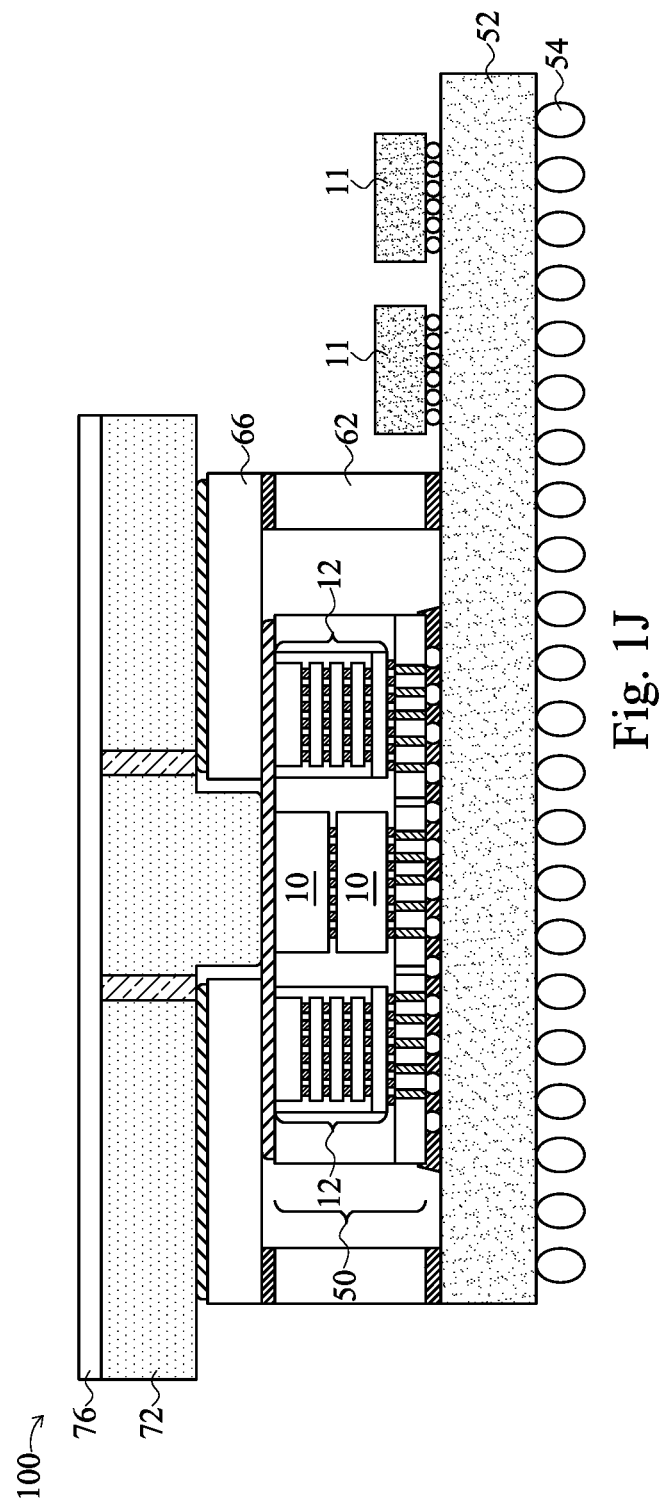

FIG. 1H illustrates the attachment of a composite heat spreader 72 over contour lid 66 and TIM 68 in CoWoS package 100. Heat spreader 72 may be attached onto the CoWoS package 100 with a mechanical fastener connected to a mother board of the system (not shown). Other mechanisms for attaching heat spreader 72 may also be used. In various embodiments, composite heat spreader 72 may be a heat sink or a portion of a heat sink, which may include a cooling element 76 (e.g., a fan). Composite heat spreader 72 may extend laterally past outer sidewalls of contour ring 62/contour lid 66, allowing for increased heat dissipation over a wider surface area.

Composite heat spreader 72 may include thermal conductive portions 72a and 72b formed of high Tk materials, which may be substantially similar to the materials of heat dissipation feature 62/66. Thermal conductive portions 72a and 72b may be aligned over high-power die stack 10 and low-power die stacks 12, respectively. Furthermore, thermal conductive portion 72a over die stack 10 may extend into opening 70 of contour lid 66. A bottom surface of thermal conductive portion 72a may be in physical contact with TIM 58 and may conduct heat away from die stack 10 as indicated by arrows 74. Thermal conductive portions 72b may be in physical contact with TIM 68 disposed over die stacks 12. Thus, as also indicated by arrows 74, composite heat spreader 72 helps conduct heat away from low-power die stacks 12 through thermal conductive portions 72b, TIM 68, contour lid 66, and TIM 58.

Composite heat spreader 72 may further include thermal barrier portions 72c disposed between thermal conductive portions 72a and 72b. Thermal barrier portions 72c may comprise a low Tk material, for example, having a thermal conductivity less than about 0.5 W/m·K. In some embodiments, thermal barrier portions 72c comprise epoxy, unsaturated polyesters, phenolics, adhesives, air gaps (e.g., trenches or through-holes, discussed in greater detail below), combinations thereof, or the like. Thermal barrier portions 72c may have a horizontal dimension W1, which may be greater than about 0.5 mm, 1 mm, or even 5 mm depending on layout design. Thermal barrier portions 72c reduces the lateral spreading of heat conducted from die stacks 10 and 12 through contour lid 66, TIMs 58 and 68, and composite heat spreader 72. Thermal barrier portions 72c provide separate zones for thermal management for each die stack 10 and 12, reducing thermal crosstalk. Thus, by including the various thermal management features of CoWoS package 100 (e.g., composite heat spreader 72 and contour lid 66), heat may be dissipated in a generally vertical, as opposed to lateral, direction away from die stacks 10 and 12 as indicated by arrows 74. Thermal crosstalk may be reduced and device performance may be improved.

Figure 2:
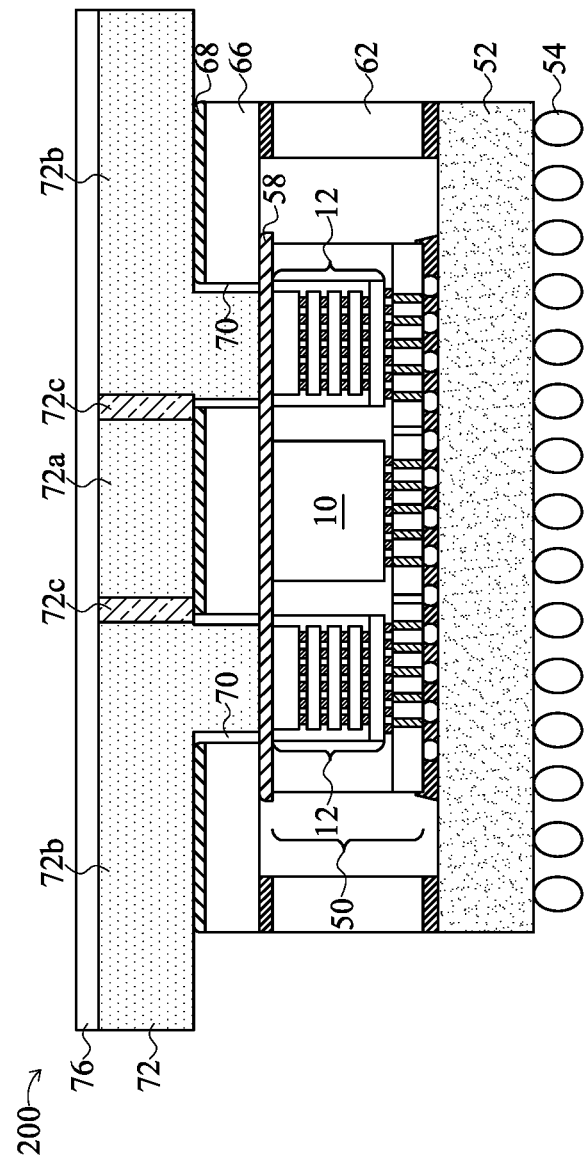
FIG. 2 illustrates a cross-sectional view of a 3DIC package in accordance with alternative embodiments.

FIG. 2 illustrates a cross-sectional view of CoWoS package 200 in accordance with alternative embodiments. CoWoS package 200 may be substantially similar to CoWoS package 100, where like reference numerals correspond with like elements. However, the configuration of contour lid 66 and heat spreader 72 may be different in CoWoS package 200. In CoWoS package 200, contour lid 66 may include two openings 70 disposed over low-power die stacks 12. TIM 58 may be dispensed over a top surface of high-power die stack 10, and a bottom surface of contour lid 66 may be in physical contact with portions of TIM 58 over high-power die stack 10.

Furthermore, heat spreader 72 may include thermal conductive portions 72b over die stacks 12, which extend into openings 70. A bottom surface of thermal conductive portion 72b may be in physical contact with portions of TIM 58 over low-power die stacks 12, and thermal conductive portions 72b may thus conduct heat away from die stacks 12. Thermal conductive portions 72a may be in physical contact with TIM 68 disposed over high-power die stack 10. Thus, composite heat spreader 72 helps conduct heat away from die stack 10 through thermal conductive portions 72a, TIM 68, contour lid 66, and TIM 58. Heat spreader 72 further includes thermal barrier portions 72c (e.g. comprising a low Tk material) disposed between thermal conductive portions 72a and 72b. Thus, heat spreader 72 reduces the lateral dissipation of heat and thermal crosstalk in CoWoS package 200.

FIG. 3 illustrates cross-sectional view of a CoWoS package 300 in accordance with various alternative embodiments. Package 300 is substantially similar to package 100, wherein like reference numbers correspond to like elements. However, the configurations of heat spreader 72 and contour lid 66 may be altered. Notably, package 300 includes a composite contour lid 66, which may not include openings (e.g., openings 70 in CoWoS package 100) aligned with die stack 10 or die stack 12. Instead, contour lid 66 may include thermal conductive portions 66a disposed over each die stack 10 and 12. Thermal barrier portions 66b may be disposed between thermal conductive portions 66a. Thermal conductive portions 66a may be formed of substantially similar materials as thermal conductive portions 72a/72b and thermal barrier portions 66b as thermal barrier portions 72c, respectively. Bottom surfaces of thermal conductive portions 66a maybe in physical contact with TIM 58. In some embodiments (such as the one illustrated in FIG. 3), TIM 58 may be separated into physically disconnected TIM portions 58a through 58c. Each TIM 58a through 58c may be disposed over a separate die stack 10 or 12. Thermal barrier portions 66b of composite contour lid 66 reduces lateral diffusion of heat during thermal dissipation.

Furthermore, CoWoS package 300 may include TIM 68 disposed over contour lid 66 and a composite heat spreader 72 over and contacting TIM 68. Heat spreader 72 includes thermal conductive portions 72a/72b over each die stack 10/12 and thermal barrier portions 72c between thermal conductive portions 72a/72b. Heat spreader 72 further reduces the lateral diffusion of heat during operations to reduce thermal crosstalk and improve device performance.

FIG. 4A illustrates a cross-sectional view of a CoWoS package 400 in accordance with various alternative embodiments. Package 400 is substantially similar to package 300, wherein like reference numbers correspond to like elements. Composite contour lid 66 may include thermal conductive portions 66a disposed over die stacks 10 and 12. Composite contour lid 66 may further include thermal barrier portions 66c disposed between thermal conductive portions 66a. Thermal barrier portions 66c in CoWoS package 400 may be air gaps and may not include any materials disposed therein. Because air has a thermal conductivity less than about 0.02 W/m·K, the inclusion of such air gaps as thermal barrier portions 66c may reduce the lateral dissipation of heat and thermal crosstalk in CoWoS package 400. Package 400 may further include TIM 68 (not shown) and a composite heat spreader 72 (not shown) disposed over contour lid 66.

Figure 4D:
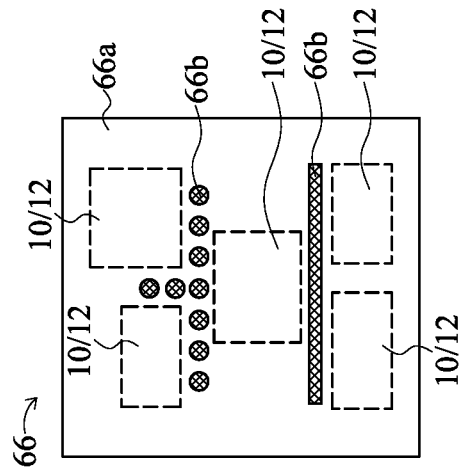
Figure 4C:
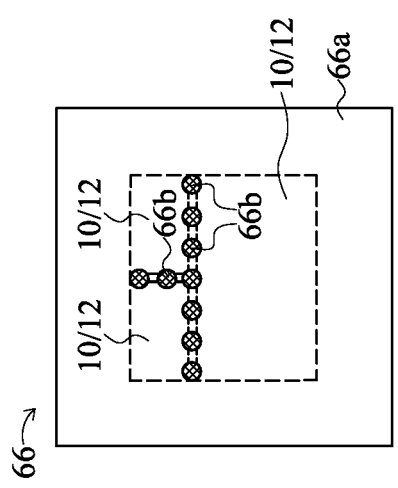
Figure 4B:
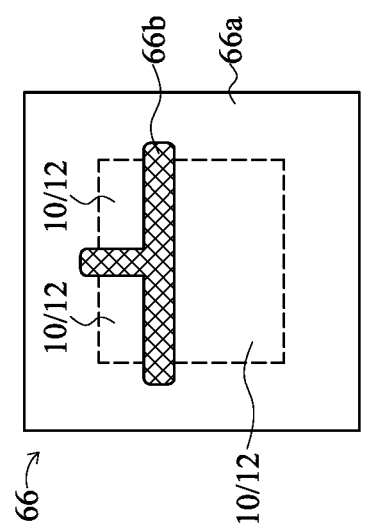

FIGS. 4B through 4D illustrate top-down views of alternative configurations of composite contour lids 66 having air gaps as thermal barrier portions 66c. Composite contour lid 66 may be disposed over high-power die stacks 10 and/or low-power die stacks 12, which are shown in ghost in FIGS. 4B through 4D. Thermal conductive portions 66a may be disposed over such die stacks 10/12 for conducting heat away from die stacks 10/12. Thermal barrier portions 66c may be disposed in regions between die stacks 10/12 (referred to as thermal crosstalk regions) to reduce the lateral dissipation of heat and thermal crosstalk. Thermal barrier portions 66c may include air gaps that are configured as trenches (e.g., illustrated in FIG. 4B), one or more through-holes (e.g., illustrated in FIG. 4C), or a combination thereof (e.g., illustrated in FIG. 4D).

Figure 4G:
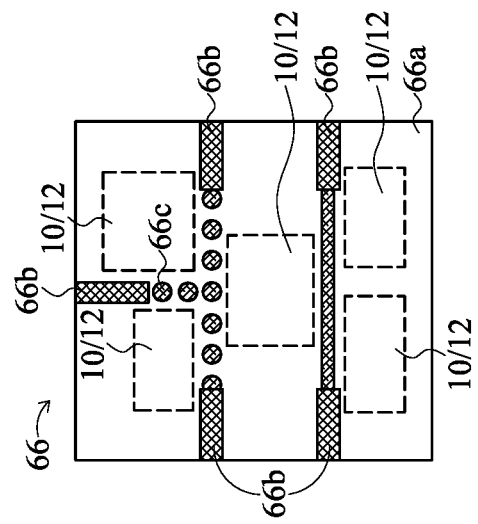
Figure 4F:
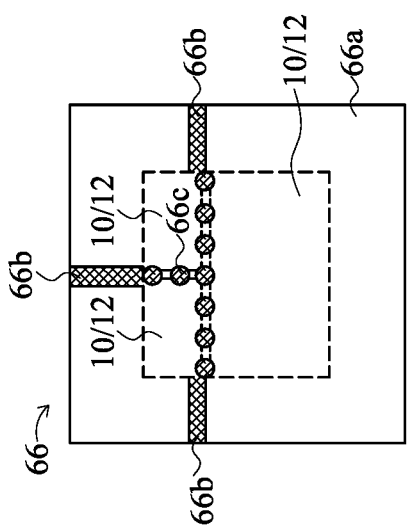
Figure 4E:
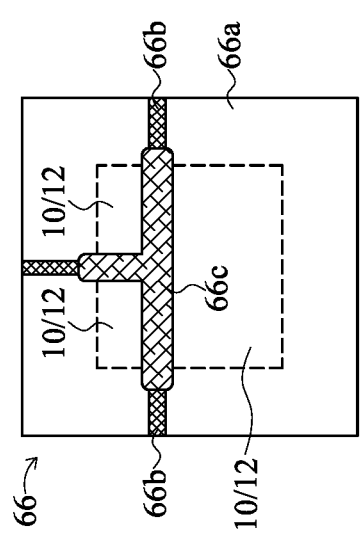

In various alternative embodiments, composite contour lid 66 may include both thermal barrier portions 66b (e.g., comprising a low Tk material) and thermal barrier portions 66c (e.g., air gaps). FIGS. 4E through 4G illustrate top-down views of alternative configurations of composite contour lid 66 having both thermal barrier portions 66b and thermal barrier portions 66c. Thermal barrier portions 66b may comprise low Tk materials and may be configured in combination with trenches (e.g., illustrated in FIG. 4E), through-holes (e.g., illustrated in FIG. 4F), or a combination of trenches and through-holes (e.g., illustrated in FIG. 4G). Thermal barrier portions 66b and 66c may be disposed between die stacks 10/12 to reduce lateral dissipation of heat and thermal crosstalk. Although FIGS. 4B through 4G illustrate composite contour lid 66, similar configurations may also be applied to composite heat spreader 72 having thermal barrier portions 72c. That is, thermal barrier portions 72c of composite heat spreader 72 may also comprise low Tk materials, air gap trenches, air gap through-holes, or a combination thereof.

Figure 5A:
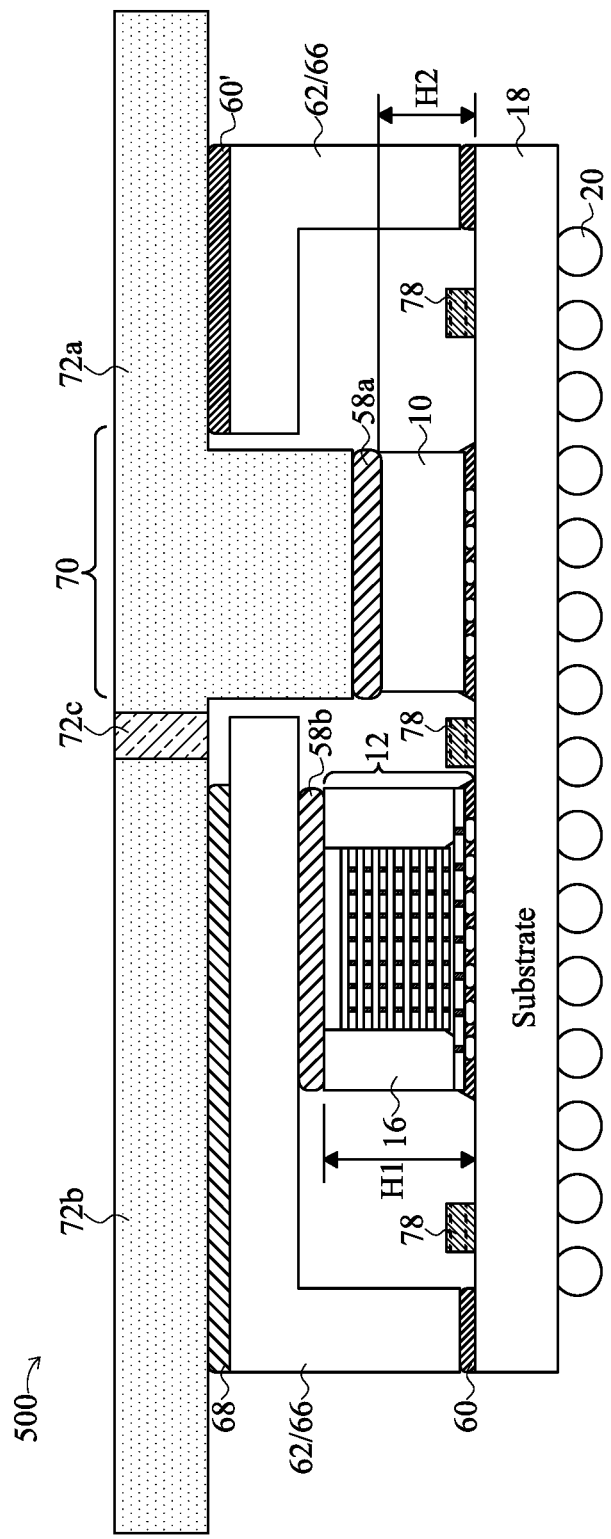
FIGS. 5A and 5B illustrate cross-sectional and top down views of a 3DIC package in accordance with alternative embodiments.

FIG. 5A illustrates a sliced cross-sectional view of a package 500 in accordance with various alternative embodiments having multiple high-power die stacks 10 and/or low-power die stacks 12 having different heights. Package 500 is substantially similar to package 100, wherein like reference numbers correspond to like elements. However, package 500 may include a high-power die stack 10 having a height H2 and a low-power die stack 12 having a height H1. Die stack 12 may be encased in a molding compound 16, which may or may not incase die stack 10. Height H1 may be different than height H2. Although FIG. 5 illustrates height H1 as greater than height H2, in alternative embodiments, height H1 may be less than height H2. Furthermore, the die stacks in package 500 may be high-power die stacks 10, low-power die stacks 12, or a combination thereof.

Figure 5B:
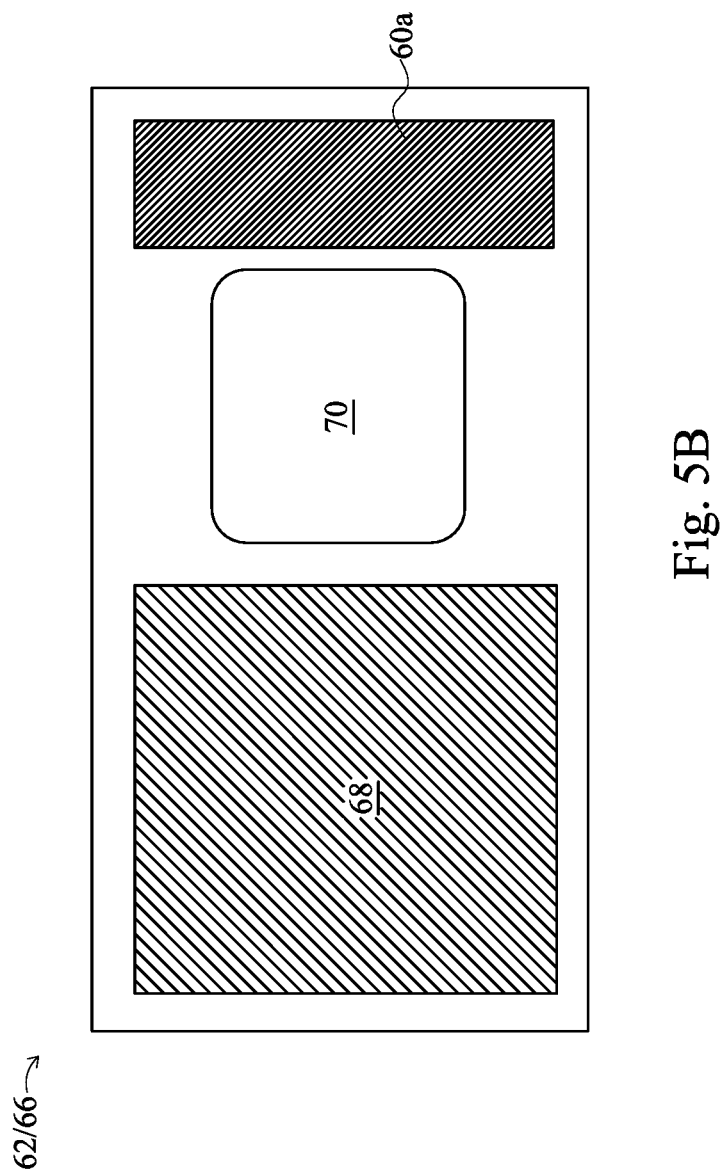

Die stacks 10 and 12 may be electrically connected to an interposer 18. Passive devices 78 (e.g., capacitors, resistors, inductors, varactors, and/or the like) may also be electrically connected to interposer 18. Alternatively, die stacks 10 and 12 and passive devices 78 may be attached to an organic or ceramic substrate. TIM 58a and 58b may be disposed over and contacting a top surface of die stacks 10 and 12, respectively. A thermal conductive feature 62/66 (e.g., a single-piece contour ring and lid) may be adhered to the substrate through adhesive 60. Thermal conductive feature 62/66 may cover die stack 12. A bottom surface of thermal conductive feature 62/66 may be in physical contact with TIM 58b. Furthermore, thermal conductive feature 62/66 may have an opening 70 aligned with die stack 10. TIM 68 may be disposed over and in physical contact with a portion of thermal conductive feature 62/66 that is in contact with TIM 58b. Adhesive 60' (which may be substantially similar to adhesive 60) may be disposed over other portions of thermal conductive features 62/66, for example, portions that are substantially free of underlying thermal contacts. FIG. 5B illustrates a top-down view of thermal conductive features 62/66 having opening 70. As illustrated in FIG. 5B, TIM 68 and adhesive 60's may be disposed over different portions of thermal conductive features 62/66.

Referring back to FIG. 5A, a composite heat spreader 72 is disposed over TIM 68 and adhesive 60a thermal conductive feature 62/66. Composite heat spreader 72 includes thermal conductive portions 72a and 72b. Thermal conductive portions 72b may be disposed over die stack 12 and may be in physical contact with TIM 68. Thermal conductive portion 72a may extend into opening 70 and be in physical contact with TIM 58a over die stack 10. A thermal barrier portion 72c (e.g., comprising a low Tk material) may be disposed between thermal conductive portions 72a and 72b. Thus a package having die stacks of different heights may include thermal management features which reduce the lateral dissipation of heat through thermal conductive feature 62/66 and composite heat spreader 72.

By using thermal management features (e.g., a combination of a contour lid and composite heat spreader), the lateral heat dissipation and thermal crosstalk may be reduced. For example, FIG. 6A illustrates a package 600 having a high-power die stack 10 and a low-power die stack 12 having such heat management features (e.g., contour lid 66 and composite heat spreader 72). Package 600 may be substantially similar to package 100 where like reference numerals represent like elements. A contour plot 602 from a simulation to simulate the temperature distribution in the package 600 during the operation of die stacks 10 and 12 is illustrated in FIG. 6B. As shown in FIG. 6B, heat flow from high-power die stack 10 was generally limited to a substantially vertical direction with reduced lateral heat dissipation. Furthermore, operation temperatures of package 600 were reduced from operational temperatures of conventional packages. For example, in the simulations, operational temperatures of package 600 ranged from about 50.9° C. to about 75.5° C., whereas operational temperatures of conventional packages range from about 90.1° C. to about 51.9° C.

Figure 6C:
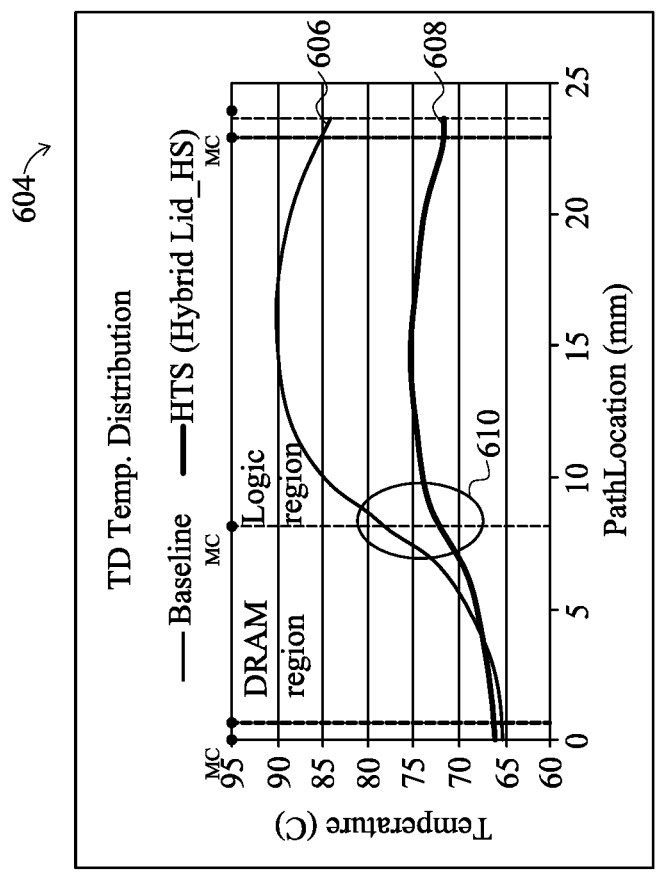

FIG. 6C illustrates a temperature plot 604 of operational temperatures across a conventional package (e.g., as represented by line 606) and package 600 (e.g., as represented by line 608) in the simulation. Region 610 corresponds to a thermal crosstalk region in the packages between die stacks 10 and 12. As illustrated by plot 604, by adopting the thermal management features illustrated in FIG. 6A, the temperature of the package in thermal crosstalk region 610 was reduced. Therefore, by adopting the thermal management features of the embodiments of the present disclosure, not only the operation temperatures of the packages are reduced, but also the temperature of regions between die stacks is reduced. As a result, thermal crosstalk and lateral dissipation of heat are reduced.

In accordance with an embodiment, a package includes a first die stack on a surface of a package component, a second die stack on the surface of the package component, and a heat-dissipating contour lid covering the first die stack. The heat dissipating contour lid includes an opening over the second die stack.

In accordance with another embodiment, a package includes a first die stack on a surface of a package component, a second die stack on the surface of the package component, and a contour lid over the first die stack and second die stack. The contour lid includes a first thermal conductive portion over the first die stack, a second thermal conductive portion over the second die stack, and a thermal barrier portion between the first thermal conductive portion and the second thermal conductive portion. The thermal barrier portion comprises a low thermal conductivity material In accordance with yet another embodiment, a method includes electrically connecting a first die stack and a second die stack to a substrate and dispensing a thermal interface material (TIM) on a top surface of the first die stack. The method further includes forming a contour lid over the first die stack. The contour lid includes a thermal conductive portion physically contacting the TIM and a thermal barrier adjacent to the thermal conductive portion.

In accordance with an embodiment, a package includes a first die bonded to a substrate, a second die adjacent the first die and bonded to the substrate, and a contour lid over the first die. The package further includes heat spreader including a first portion over the first die, and a second portion extending beneath a top surface of the contour lid and directly attach to the second die. The contour lid is disposed between the first portion of the heat spreader and the first die.

In accordance with an embodiment, a package includes a first die bonded to a surface of a package component, a second die adjacent the first die, and a lid over the first die and second die. The lid includes a first thermal conductive portion, a second thermal conductive portion, and a thermal barrier contacting a first sidewall of the first thermal conductive portion and a second sidewall of the second thermal conductive portion. The thermal barrier includes a different material than that first thermal conductive portion and the second thermal conductive portion, and the thermal barrier is disposed directly over a spacing between the first die and the second die.

In accordance with an embodiment, a method includes bonding a first die to a substrate, bonding a second die to the substrate and adjacent the first die, and attaching a contour lid over the first die and the second die. The contour lid includes a first thermal conductive portion over the first die, a second thermal conductive portion over the second die, and a first thermal barrier contacting the first thermal conductive portion and the second thermal conductive portion. The first thermal barrier includes a different material than the first thermal conductive portion and the second thermal conductive portion.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
a first die bonded to a substrate;
a second die adjacent the first die and bonded to the substrate;
a contour lid over the first die; and
a heat spreader comprising:
   a first portion over the first die, wherein the contour lid is disposed between the first portion and the first die; and
   a second portion extending beneath a top surface of the contour lid and directly attach to the second die.

2. The package of claim 1, wherein the heat spreader further comprises a thermal barrier disposed between the first portion and the second portion.

3. The package of claim 2, wherein thermal barrier comprises a low thermal conductivity material having a thermal conductivity less than about 0.05 watts per meter kelvin, one or more air gaps, or a combination thereof.

4. The package of claim 3, wherein the thermal barrier comprises a plurality of through-holes extending through the heat spreader, wherein high thermal conductivity material having a thermal conductivity greater than the low thermal conductivity material is disposed between each of the plurality of through-holes.

5. The package of claim 3, wherein the thermal barrier comprises a continuous trench extending continuously from between opposing sides of the first die in a top down view.

6. The package of claim 1, wherein the first die has a first height, and wherein the second die has a second height different than the first height.

7. The package of claim 1 further comprising a first thermal interface material (TIM) and a second TIM physically separated from the first TIM, wherein the first TIM attaches the first portion of the heat spreader to the contour lid, and wherein the second TIM attaches the second portion of the heat spreader to the second die.

8. A package comprising:
a first die bonded to a surface of a package component;
a second die adjacent the first die; and
a lid over the first die and second die, wherein the lid comprises:
   a first thermal conductive portion;
   a second thermal conductive portion; and
   a first thermal barrier contacting a first sidewall of the first thermal conductive portion and a second sidewall of the second thermal conductive portion, wherein the first thermal barrier comprises a different material than that first thermal conductive portion and the second thermal conductive portion, and wherein the first thermal barrier is disposed directly over a spacing between the first die and the second die.

9. The package of claim 8, further comprising a first thermal interface material (TIM) on a top surface of the first die and a second TIM on a top surface of the second die, wherein first TIM attaches the first thermal conductive portion to the first die, and wherein second TIM attaches the second thermal conductive portion to the second die.

10. The package of claim 9, wherein the first TIM does not contact the second TIM.

11. The package of claim 8, wherein the first thermal barrier comprises an epoxy, an unsaturated polyester, a phenolic, an adhesive, or a combination thereof.

12. The package of claim 8, wherein the first thermal barrier comprises one or more through holes.

13. The package of claim 8, wherein the first thermal barrier comprises a trench.

14. The package of claim 8 further comprising an air gap between the first thermal conductive portion and the second thermal conductive portion.

15. The package of claim 8, further comprising a composite heat spreader over the lid, wherein the composite heat spreader comprises:
   a third thermal conductive portion over the first thermal conductive portion;
   a fourth thermal conductive portion over the second thermal conductive portion; and
   a second thermal barrier between the third thermal conductive portion and the fourth thermal conductive portion, wherein the second thermal barrier comprises a different material than the third thermal conductive portion and the fourth thermal conductive portion.

16. A method comprising:
bonding a first die to a substrate;
bonding a second die to the substrate and adjacent the first die;
attaching a contour lid over the first die and the second die, wherein the contour lid comprises:
   a first thermal conductive portion over the first die;
   a second thermal conductive portion over the second die; and
   a first thermal barrier contacting the first thermal conductive portion and the second thermal conductive portion, wherein the first thermal barrier comprises a different material than the first thermal conductive portion and the second thermal conductive portion.

17. The method of claim 16, wherein the first thermal barrier comprises a plurality of through-holes extending through the contour lid, wherein a low thermal conductivity material of the first thermal barrier is disposed within the plurality of through-holes.

18. The method of claim 16, wherein attaching the contour lid comprises:

attaching the first thermal conductive portion to the first die using a first thermal interface material (TIM); and attaching the second thermal conductive portion to the second die using a second TIM physically separated from the first TIM.

19. The method of claim 16, wherein the first thermal barrier comprises an epoxy, an unsaturated polyester, a phenolic, an adhesive, or a combination thereof.

20. The method of claim 16 further comprising attaching a composite heat spreader over the contour lid, wherein the composite heat spreader comprises:
   a third thermal conductive portion over the first thermal conductive portion;
   a fourth thermal conductive portion over the second thermal conductive portion; and
   a second thermal barrier between the third thermal conductive portion and the fourth thermal conductive portion, wherein the second thermal barrier comprises a different material than the third thermal conductive portion and the fourth thermal conductive portion.

* * * * *